(12) United States Patent
Okamoto

(10) Patent No.: US 6,320,241 B1
(45) Date of Patent: Nov. 20, 2001

(54) CIRCUITRY AND METHOD OF FORMING THE SAME

(75) Inventor: Hitoshi Okamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/375,437

(22) Filed: Aug. 17, 1999

(30) Foreign Application Priority Data

Aug. 17, 1998 (JP) ................................. 10-230697

(51) Int. Cl.⁷ ............................................. H01L 29/00
(52) U.S. Cl. ........................ 257/528; 257/533; 257/536
(58) Field of Search .................................. 257/528, 533, 257/536, 363, 358

(56) References Cited

U.S. PATENT DOCUMENTS 4,710,791 * 12/1987 Shirato et al. ............... 357/23.13

FOREIGN PATENT DOCUMENTS

| 6284545 | 4/1987 | (JP) . |
| 2162759 | 6/1990 | (JP) . |
| 5151716 | 6/1993 | (JP) . |
| 7202126 | 8/1995 | (JP) . |

* cited by examiner

Primary Examiner—Nathan Flynn
Assistant Examiner—Remmon R. Fordé
(74) Attorney, Agent, or Firm—Young & Thompson

(57) ABSTRACT

A circuit between at least a connective terminal and at least a semiconductor circuit device includes at least a resistive element; a first interconnection inter-connecting a first side portion of the resistive element to the semiconductor circuit device; and a second interconnection inter-connecting a second side portion of the resistive element to the connective terminal, wherein at least a center portion except for the first and second side portions of the resistive element extends on a thin insulator portion which is provided on a semiconductor region, so that the thin insulator portion is sandwiched between the semiconductor region and the at least the center portion of the resistive element. The first and second portions of the resistive element extend on a thick insulator portion which is thicker than the thin insulator portion, and the semiconductor region is electrically connected to the second interconnection so as to allow a potential of the semiconductor region to follow a potential of the resistive element.

19 Claims, 18 Drawing Sheets

CIRCUITRY AND METHOD OF FORMING THE SAME

BACKGROUND OF THE INVENTION

The present invention relates to a circuitry for switching transistors and a method of forming the same.

A circuitry in the form of a single chip is applied to various types of electronic components. This circuitry has a single substrate onto which a large number of semiconductor circuits are integrated.

The circuitry in the form of the single chip has a large number of lead pins which project from a resin package for connections to electronic components. The substrate onto which the semiconductor circuits are integrated is sealed within the resin package. On the circuit substrate, metal interconnections and connective terminals are provided in the form of a thin film together with the semiconductor circuits, wherein the semiconductor circuits are connected through the metal interconnections to the connective terminals. A large number of the connective terminals of the circuit substrate are connected through bonding wires to a large number of the lead pins, so that the lead pins are thus electrically connected indirectly to the semiconductor circuits sealed within the resin package. It is, however, possible that a high voltage is applied to the lead pins externally projecting from the circuitry, wherein such the high voltage may break the semiconductor circuit.

In order to prevent this problem, resistances are individually provided for every connective terminals of the circuit substrate, wherein the resistances are connected between the semiconductor circuit and the connective terminals, so that a surge current having entered from the connective terminal is smoothed by the resistances to prevent the semiconductor circuits from breaking.

If the circuitry has a metal oxide semiconductor structure, then a field oxide film is formed over a surface of the circuit substrate for isolating the semiconductor circuits, for which reason the resistances are provided over the field oxide film.

In accordance with this structure, the circuit substrate is grounded to be fixed at a reference voltage. If a high voltage is applied to the resistance, the high voltage is also applied to the field oxide film positioned between the resistances and the circuit substrate, whereby the field oxide film is also broken. Japanese laid-open patent publication no. 6-151716 discloses that other circuitry designed for solving this problem.

FIG 1. is a fragmentary cross sectional elevation view illustrative of a conventional circuitry designed to prevent the field oxide film positioned between the resistances and the circuit substrate from being broken by a high voltage application.

A circuitry 100 has a first conductivity type circuit substrate, for example, a p-type substrate 101. This p-type substrate 101 is grounded. A semiconductor circuit (not illustrated) is formed on a predetermined area of a surface of the p-type substrate 101. Field oxide films 102 are also provided on the other area than the predetermined area (not illustrated) of the surface of the p-type substrate 101 for isolating the semiconductor circuit from a peripheral region. A field effect transistor 105 is provided over a surface area which is separated from the predetermined area on which the circuit is formed. The field effect transistor 105 is connected through an interconnection to the circuit (not illustrated). A resistive film 104 is also provided over the field oxide film 102, wherein the resistive film 104 is connected to the field effect transistor 105. Interlayer insulators are also provided on the field oxide film 102. A via hole is formed which penetrates the inter-layer insulator, so that the contact hole is positioned over a part of the resistive film 104. A connective terminal 103 is also provided which extends over the inter-layer insulator and also within the contact hole so that the connective terminal 103 is connected with the resistive film 104, whereby the connective terminal 103 is electrically connected through the resistive film 104 and the field effect transistor 105 to the circuit on the predetermined area of the p-type substrate 101. A through hole is also provided in the field oxide film so that the through hole is positioned under a part of the resistive film 104. The resistive film 104 also extends within the through hole in the field oxide film 102. An n-well 106 is provided in an upper region of the p-type substrate 101 so that the n-well 106 is positioned under the field oxide film 102 which is positioned under the resistive film 104 so that the n-well 106 is positioned under the resistive film 104. The n-well 106 is connected with the resistive film 104 within the through hole in the field oxide film 102.

The above described circuitry 100 is sealed within a resin package, so that the connective terminal 103 is further connected through a bonding wire (not illustrated) to a lead pin. Although only the single connective terminal 103 is illustrated, actually however a large number of the connective terminals 103 are connected to the bonding wires to the same number or large number of the lead pins. Input and output signals are transmitted through the connective terminal 103, the resistive film 104, the field effect transistor 105 to the circuit.

When static electricity is generated and a high voltage is applied to the connective terminal 103, so that a surge current flows through the connective terminal 103 and smoothed by the resistive film 104, thereby preventing the circuit from breaking. Further, the resistive film 104 is connected to the n-well 106, thereby preventing the field oxide film 102 from breaking. Namely, although the p-type substrate 101 is grounded, the high voltage surface current is applied not only the resistive film 104 but also the n-well 106. No large potential difference is applied to the field oxide film 102 sandwiched between the resistive film 104 and the n-well 106. The surge current applied to the connective terminal 103 flows through the resistive film 104 an the field effect transistor 105 to the p-type substrate 101 which is grounded.

Meanwhile, recent circuitry and electronic components have reduced electric resistances and use signals of high frequency. In this circumstance, the primary object of provision of the resistive film has been changing from the protection of the semiconductor circuit to impedance matching. The resistance values have also been on decrease year by year.

The above circuitry 100 allows the resistive film 104 to prevent the semiconductor circuit from breaking even in the event of high voltage surge current and also allows the n-well 106 to prevent the field oxide film 102 from breaking even when the high voltage is applied to the resistive film 104.

The above circuitry 100 is however not optimized in structure, whereby the protection of the field oxide film 102 from breaking is insufficient. Namely, a difference in position between the contact hole connecting the connective terminal 103 and the resistive film 104 and the through hole connecting the resistive film 104 to the n-well 106. At the time when the high voltage surge current has just reached the part of the resistive film 104 under the contact hole, the potential of the n-well region 106 has not yet been increased, whereby the part of the resistive film 104 under the contact hole is different in potential from the n-well region 106. This means that at the time when the high voltage surge current has just reached the part of the resistive film 104 under the contact hole, so that a high voltage is applied to the field oxide film 102 sandwiched between the n-well 106 and the resistive film 104, whereby the field oxide film 102 may be broken.

Further, if the frequency of the signal to be inputted into the connective terminal 103 is high, there is increased an amount of the current per one unit time flowing through the resistive film 104 to an input capacitance of the circuit. This causes a further increase in heat rate per one unit time of the resistive film 104. If the heat generated by the resistive film 104 is transmitted to the p-type substrate 101, this heat is radiated therefrom. Actually, however, the resistive film 104 is isolated by the field oxide film 102 from the p-type substrate 101, for which reason it is difficult that the heat is transmitted from the resistive film 104 to the p-type substrate 101.

In the above circumstances, it had been required to develop a novel circuitry free from the above problem.

SUMMARY OF THE INVENTION

Accordingly, it is an object of the present invention to provide a novel circuitry free from the above problems.

It is a further object of the present invention to provide a novel circuitry preventing a semiconductor circuit from breaking.

It is a still further object of the present invention to provide a novel circuitry preventing an insulation film from breaking.

It is yet a further object of the present invention to provide a novel circuitry allowing a radiation of a heat generated by the resistive element of the circuitry.

It is further more object of the present invention to provide a novel method of forming a circuitry free from the above problems.

It is moreover object of the present invention to provide a novel method of forming a circuitry preventing a semiconductor circuit from breaking.

It is still more object of the present invention to provide a novel method of forming a circuitry preventing an insulation film from breaking.

It is yet more object of the present invention to provide a novel method of forming a circuitry allowing a radiation of a heat generated by the resistive element of the circuitry.

The first aspect of the present invention provides a circuitry between at least a connective terminal and at least a semiconductor circuit device. The circuitry comprises: at least a resistive element; a first interconnection inter-connecting a first side portion of the resistive element to the semiconductor circuit device; and a second interconnection inter-connecting a second side portion of the resistive element to the connective terminal, wherein at least a center portion except for the first and second side portions of the resistive element extends on a thin insulator portion which is provided on a semiconductor region, so that the thin insulator portion is sandwiched between the semiconductor region and the at least the center portion of the resistive element, whilst the first and second portions of the resistive element extend on a thick insulator portion which is thicker than the thin insulator portion, and wherein the semiconductor region is electrically connected to the second interconnection so as to allow a potential of the semiconductor region to follow a potential of the resistive element.

The second aspect of the present invention provides a circuitry between at least a connective terminal and at least a semiconductor circuit device. The circuitry comprises: at least a resistive element; a first interconnection inter-connecting the resistive element to the semiconductor circuit device; and a second interconnection inter-connecting the resistive element to the connective terminal, wherein at least the resistive element extends on at least a part of an insulator extends on at least a semiconductor region, so that the at least a part of the insulator is sandwiched between the semiconductor region and the resistive element.

The third aspect of the present invention provides a circuitry between at least a connective terminal and at least a semiconductor circuit device. The circuitry comprises: at least a resistive element; a first interconnection inter-connecting a first side portion of the resistive element to the semiconductor circuit device; and a second interconnection inter-connecting a second side portion of the resistive element to the connective terminal, wherein at least a center portion except for the first and second side portions of the resistive element extends on a non-laminated part of a thin insulation film extending on at least a semiconductor well region of a first conductivity type, so that the thin insulation film is sandwiched between the semiconductor well region and the at least the center portion of the resistive element, whilst the first and second portions of the resistive element extend on a laminated part of the thick insulator portion which is laminated on a field oxide film which is thicker than the thin insulation film, and wherein the semiconductor well region is electrically connected to the second interconnection so as to allow a potential of the semiconductor region to follow a potential of the resistive element.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
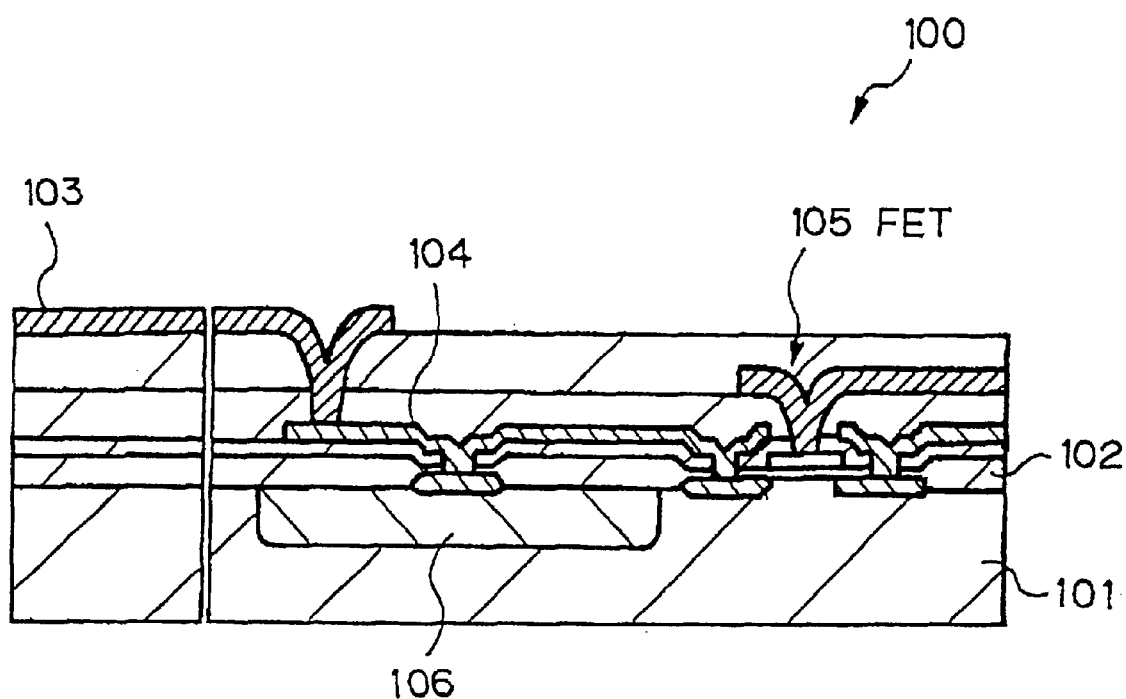
FIG. 1 is a fragmentary cross sectional elevation view illustrative of a conventional circuitry designed to prevent that the field oxide film positioned between the resistances and the circuit substrate is broken by a high voltage application.

The first aspect of the present invention provides a circuitry between at least a connective terminal and at least a semiconductor circuit device. The circuitry comprises: at least a resistive element; a first interconnection inter-connecting a first side portion of the resistive element to the semiconductor circuit device; and a second interconnection inter-connecting a second side portion of the resistive element to the connective terminal, wherein at least a center portion except for the first and second side portions of the resistive element extends on a thin insulator portion which is provided on a semiconductor region, so that the thin insulator portion is sandwiched between the semiconductor region and the at least the center portion of the resistive element, whilst the first and second portions of the resistive element extend on a thick insulator portion which is thicker than the thin insulator portion, and wherein the semiconductor region is electrically connected to the second interconnection so as to allow a potential of the semiconductor region to follow a potential of the resistive element.

It is preferable that the semiconductor region comprises a semiconductor well region of a first conductivity type.

It is further preferable that the semiconductor well region is provided in a semiconductor substrate of a second conductivity type.

It is also preferable that the semiconductor well region is formed in a larger semiconductor well region having the first conductivity type which is provided in a semiconductor substrate of a second conductivity type.

It is preferable that the semiconductor well region is formed in a field oxide film, and the semiconductor well region and the field oxide film are provided on a silicon on insulator substrate.

It is preferable that the thin insulator portion comprises a thin insulation film, whilst the thick insulator comprises laminations of a thick insulation film and the thin insulation film.

It is preferable that a ratio in thickness of the thin insulator portion to the thick insulator portion is in the range of 1/2 to 1/100.

When input or output signals are inputted into or outputted from the above novel circuitry, it is possible that a high voltage surge current may be applied to the connective terminal due to static electricity. In accordance with the above first present invention, however, the connective terminal and the semiconductor circuit device, for example, a field effect transistor are indirectly connected through the resistive element which prevents the high voltage surge current from reaching the semiconductor circuit device thereby to prevent the semiconductor circuit device from breaking.

The resistive element is isolated by the thin insulator portion from the substrate having the semiconductor region such as the well region, wherein the thin insulator portion is sandwiched between the semiconductor region such as the well region and the resistive element. Further, the resistive element is also electrically connected to the semiconductor region such as the well region. If the high voltage surge current is applied to the resistive element, then the potential of the semiconductor region such as the well region is also increased to the same potential as the resistive element, whereby no high voltage is applied across the thin insulator portion between the resistive element and the semiconductor region such as the well region. Namely, when the high voltage surge current is applied to the resistive element, the surge current flows to the semiconductor region such as the well region, whereby the potential of the semiconductor region such as the well region is changed to follow the potential of the resistive element, and no large potential difference is caused between the resistive element and the semiconductor region such as the well region, thereby preventing the thin insulator portion from breaking.

Further, the p-n junction between the substrate of the second conductivity type and the semiconductor region such as the well region of the first conductivity type serves as a parasitic diode, for which reason a normal voltage level current which is different from the above high voltage surge current does not flow across the p-n junction between substrate of the second conductivity type and the semiconductor region such as the well region of the first conductivity type, and thus no normal voltage level current is applied to the substrate. However, abnormally high voltage current, for example, the surge current penetrates through the p-n junction between substrate of the second conductivity type and the semiconductor region such as the well region of the first conductivity type, for example, causes the break down of the parasitic diode, whereby the surge current flows to the substrate, thereby preventing the thin insulator portion and the semiconductor circuit device from breaking.

Only thin insulator portion is provided between the resistive element and the semiconductor region such as the well region. If a heat generation appears in the resistive element by the current application, this heat may be transferred to the substrate, thereby preventing the thin insulator portion from any substantive damage due to the heat generation from the second interconnection.

Since only thin insulator portion is provided between the resistive element and the semiconductor region such as the well region, this means that a reduced heat resistance which is lower than the case of the thick insulator portion extending between the resistive element and the semiconductor region such as the well region, This means that a temperature rising rate of the resistive element is reduced as compared to the case of the thick insulator portion extending between the resistive element and the semiconductor region such as the well region.

The second aspect of the present invention provides a circuitry between at least a connective terminal and at least a semiconductor circuit device. The circuitry comprises: at least a resistive element; a first interconnection inter-connecting the resistive element to the semiconductor circuit device; and a second interconnection inter-connecting the resistive element to the connective terminal, wherein at least the resistive element extends on at least a part of an insulator extends on at least a semiconductor region, so that the at least a part of the insulator is sandwiched between the semiconductor region and the resistive element.

It is preferable that the resistive element has a first side portion in contact with the first interconnection, and a second side portion in contact with the second interconnection, and the insulator comprises a thin insulator portion which is provided on a semiconductor region and a thick insulator portion, and the resistive element except for the first and second side portions extends on the thin insulator portion, so that the thin insulator portion is sandwiched between the semiconductor region and the at least the center portion of the resistive element, whilst the first and second portions of the resistive element extend on the thick insulator portion.

It is also preferable that the resistive element has a first side portion in contact with the first interconnection, and a second side portion in contact with the second interconnection, and the insulator has a single-layered structure which comprises a field oxide film extending on at least a semiconductor region, and the resistive element extends on a part of the field oxide film, so that the part of the thin insulator portion is sandwiched between the semiconductor region and the resistive element.

It is also preferable that the semiconductor region is electrically connected to the second interconnection so as to allow a potential of the semiconductor region to follow a potential of the resistive element.

It is also preferable that the semiconductor region comprises a semiconductor well region of a first conductivity type.

It is further preferable that the semiconductor well region is formed in a semiconductor substrate of a second conductivity type.

It is also preferable that the semiconductor well region is formed in a field oxide film, and the semiconductor well region and the field oxide film are provided on a silicon on insulator substrate.

It is also preferable that the thin insulator portion comprises a thin insulation film, whilst the thick insulator comprises laminations of a thick insulation film and the thin insulation film.

It is further preferable that a ratio in thickness of the thin insulator portion to the thick insulator portion is in the range of 1/2 to 1/100.

When input or output signals are inputted into or outputted from the above novel circuitry, it is possible that a high voltage surge current may be applied to the connective terminal due to static electricity. In accordance with the above first present invention, however, the connective terminal and the semiconductor circuit device, for example, a field effect transistor are indirectly connected through the resistive element which prevents the high voltage surge current from reaching the semiconductor circuit device thereby to prevent the semiconductor circuit device from breaking.

The resistive element is isolated by the thin insulator portion from the substrate having the semiconductor region such as the well region, wherein the thin insulator portion is sandwiched between the semiconductor region such as the well region and the resistive element. Further, the resistive element is also electrically connected to the semiconductor region such as the well region. If the high voltage surge current is applied to the resistive element, then the potential of the semiconductor region such as the well region is also increased to the same potential as the resistive element, whereby no high voltage is applied across the thin insulator portion between the resistive element and the semiconductor region such as the well region. Namely, when the high voltage surge current is applied to the resistive element, the surge current flows to the semiconductor region such as the well region, whereby the potential of the semiconductor region such as the well region is changed to follow the potential of the resistive element, and no large potential difference is caused between the resistive element and the semiconductor region such as the well region, thereby preventing the thin insulator portion from breaking.

Further, the p-n junction between the substrate of the second conductivity type and the semiconductor region such as the well region of the first conductivity type serves as a parasitic diode, for which reason a normal voltage level current which is different from the above high voltage surge current does not flow across the p-n junction between substrate of the second conductivity type and the semiconductor region such as the well region of the first conductivity type, and thus no normal voltage level current is applied to the substrate. However, abnormally high voltage current, for example, the surge current penetrates through the p-n junction between substrate of the second conductivity type and the semiconductor region such as the well region of the first conductivity type, for example, causes the break down of the parasitic diode, whereby the surge current flows to the substrate, thereby preventing the thin insulator portion and the semiconductor circuit device from breaking.

Only thin insulator portion is provided between the resistive element and the semiconductor region such as the well region. If a heat generation appears in the resistive element by the current application, this heat may be transferred to the substrate, thereby preventing the thin insulator portion from any substantive damage due to the heat generation from the second interconnection.

Since only thin insulator portion is provided between the resistive element and the semiconductor region such as the well region, this means that a reduced heat resistance which is lower than the case of the thick insulator portion extending between the resistive element and the semiconductor region such as the well region. This means that a temperature rising rate of the resistive element is reduced as compared to the case of the thick insulator portion extending between the resistive element and the semiconductor region such as the well region.

The third aspect of the present invention provides a circuitry between at least a connective terminal and at least a semiconductor circuit device. The circuitry comprises: at least a resistive element; a first interconnection inter-connecting a first side portion of the resistive element to the semiconductor circuit device; and a second interconnection inter-connecting a second side portion of the resistive element to the connective terminal, wherein at least a center portion except for the first and second side portions of the resistive element extends on a non-laminated part of a thin insulation film extending on at least a semiconductor well region of a first conductivity type, so that the thin insulation film is sandwiched between the semiconductor well region and the at least the center portion of the resistive element, whilst the first and second portions of the resistive element extend on a laminated part of the thick insulator portion which is laminated on a field oxide film which is thicker than the thin insulation film, and wherein the semiconductor well region is electrically connected to the second interconnection so as to allow a potential of the semiconductor region to follow a potential of the resistive element.

It is preferable that the semiconductor well region is provided in a semiconductor substrate of a second conductivity type.

It is also preferable that the semiconductor well region is formed in a larger semiconductor well region having the first conductivity type which is provided in a semiconductor substrate of a second conductivity type.

It is also preferable that the semiconductor well region is formed in the field oxide film, and the semiconductor well region and the field oxide film are provided on a silicon on insulator substrate.

It is also preferable that a ratio in thickness of the thin insulator portion to the thick insulator portion is in the range of 1/2 to 1/100.

When input or output signals are inputted into or outputted from the above novel circuitry, it is possible that a high voltage surge current may be applied to the connective terminal due to static electricity. In accordance with the above first present invention, however, the connective terminal and the semiconductor circuit device, for example, a field effect transistor are indirectly connected through the resistive element which prevents the high voltage surge current from reaching the semiconductor circuit device thereby to prevent the semiconductor circuit device from breaking.

The resistive element is isolated by the thin insulator portion from the substrate having the semiconductor well region, wherein the thin insulator portion is sandwiched between the semiconductor well region and the resistive element. Further, the resistive element is also electrically connected to the semiconductor well region. If the high voltage surge current is applied to the resistive element, then the potential of the semiconductor well region is also increased to the same potential as the resistive element, whereby no high voltage is applied across the thin insulator portion between the resistive element and the semiconductor well region. Namely, when the high voltage surge current is applied to the resistive element, the surge current flows to the semiconductor well region, whereby the potential of the semiconductor well region is changed to follow the potential of the resistive element, and no large potential difference is caused between the resistive element and the semiconductor well region, thereby preventing the thin insulator portion from breaking.

Further, the p-n junction between the substrate of the second conductivity type and the semiconductor well region of the first conductivity type serves as a parasitic diode, for which reason a normal voltage level current which is different from the above high voltage surge current does not flow across the p-n junction between substrate of the second conductivity type and the semiconductor well region of the first conductivity type, and thus no normal voltage level current is applied to the substrate. However, abnormally high voltage current, for example, the surge current penetrates through the p-n junction between substrate of the second conductivity type and the semiconductor well region of the first conductivity type, for example, causes the break down of the parasitic diode, whereby the surge current flows to the substrate, thereby preventing the thin insulator portion and the semiconductor circuit device from breaking.

Only thin insulator portion is provided between the resistive element and the semiconductor well region. If a heat generation appears in the resistive clement by the current application, this heat may be transferred to the substrate, thereby preventing the thin insulator portion from any substantive damage due to the heat generation from the second interconnection.

Since only thin insulator portion is provided between the resistive element and the semiconductor well region, this means that a reduced heat resistance which is lower than the case of the field oxide film extending between the resistive element and the semiconductor well region. This means that a temperature rising rate of the resistive element is reduced as compared to the case of the field oxide film extending between the resistive element and the semiconductor well region.

First Embodiment

Figure 2A:
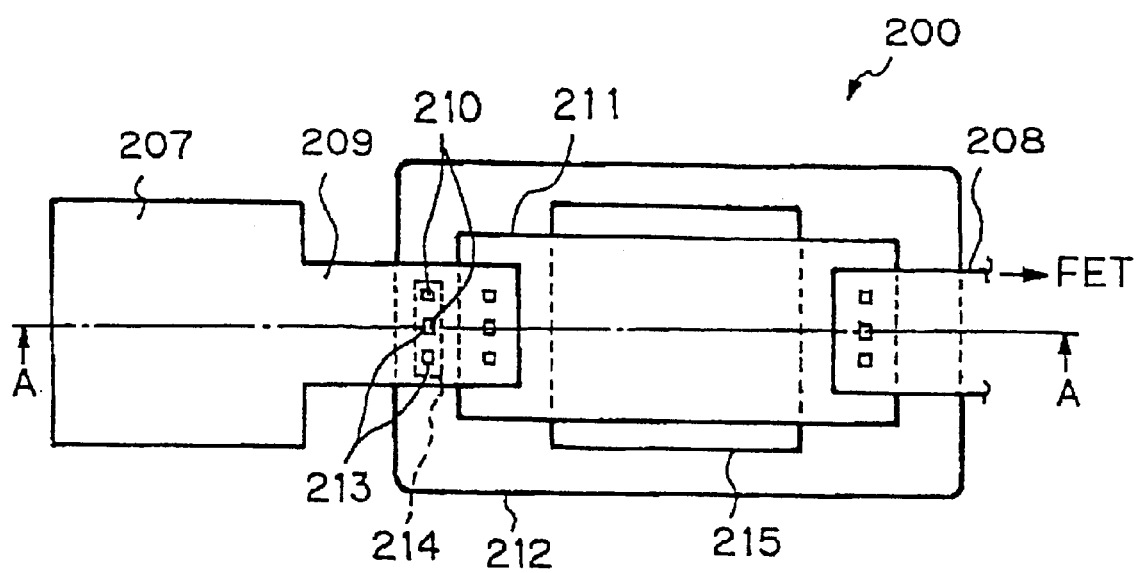
FIG. 2A is a fragmentary plan view illustrative of a novel circuitry in a first embodiment in accordance with the present invention.
Figure 2B:
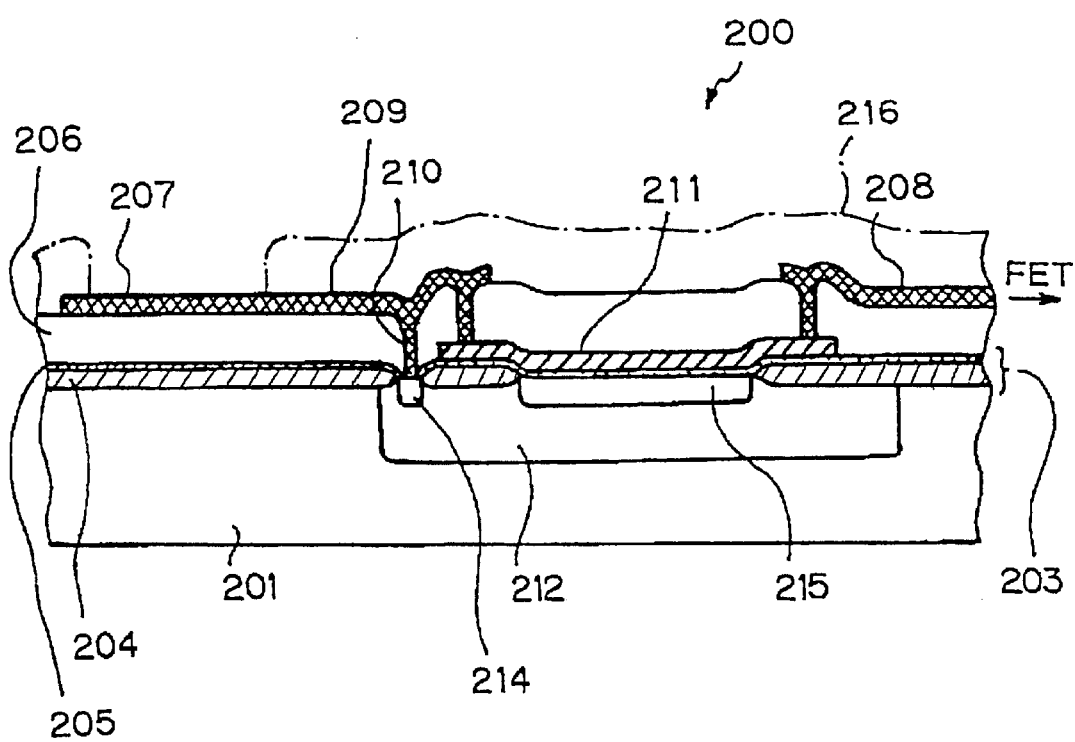
FIG. 2B is a fragmentary cross sectional elevation view illustrative of a novel circuitry taken along an A—A line of FIG. 2A.
Figure 3:
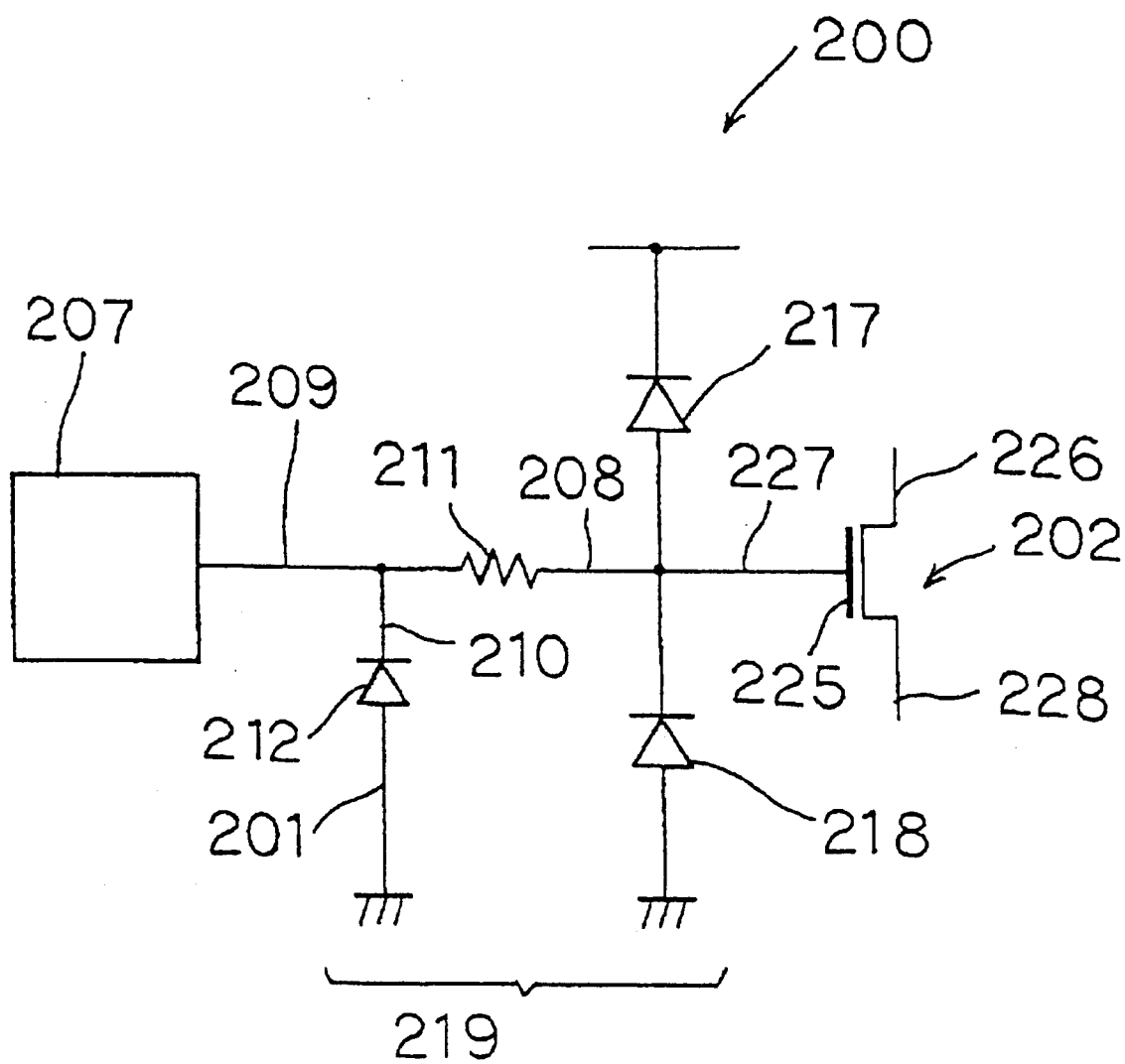
FIG. 3 is a circuit diagram illustrative of an equivalent circuit of the circuitry shown in FIGS. 2A and 2B.

A first embodiment according to the present invention will be described in detail with reference to the drawings. FIG. 2A is a fragmentary plane view illustrative of a novel circuitry in a first embodiment in accordance with the present invention. FIG. 2B is a fragmentary cross sectional elevation view illustrative of a novel circuitry taken along an A—A line of FIG. 2A. FIG. 3 is a circuit diagram illustrative of an equivalent circuit of the circuitry shown in FIGS. 2A and 2B. FIGS. 4A through 4D are fragmentary cross sectional elevation views illustrative of circuitry in sequential steps involved in a novel method of forming the circuitry shown in FIGS. 2A and 2B.

The circuitry 200 has a first conductivity type substrate or a p-type substrate 201. A field effect transistor 202 as a semiconductor circuit is provided on a predetermined area of a surface of the p-type substrate 201. An insulation film 203 extends over the surface of the p-type substrate 201, wherein the insulation film 203 has a double layered structure or comprises laminations of a field oxide film 204 and an insulation thin film 205 on the field oxide film 204. The insulation thin film 205 and the field oxide film 204 are made of insulator which has the same composition. The thickness of the insulation thin film 205 is one fifth of the thickness of the field oxide film 204. The laminations of the field oxide film 204 and the insulation thin film 205 extend over the surface of the p-type substrate 201 so that the field effect transistor as the semiconductor circuit is isolated by the laminations of the field oxide film 204 and the insulation thin film 205.

An inter-layer insulator 206 is uniformly provided over the insulation thin film 205. A connective terminal 207 extends over the interlayer insulator 206 which extends over a first region of the p-type substrate 201. A first interconnection 208 extends over the inter-layer insulator 206 which extends over a second region of the p-type substrate 201. A second interconnection 209 is also provided which is connected with the connective terminal 207 and extends over the inter-layer insulator 206 over the first region of the pR-type substrate 201. Through holes are formed in the inter-layer insulator 206 and positioned at boundaries between an intermediate region and the first region and between the intermediate region and the second region, wherein the intermediate region is between the first and second regions. The first interconnection 208 also extends within the through hole. A third interconnection 210 is also provided which is connected with the second interconnection and extend within the through hole. The first interconnection 208 is connected to the field effect transistor 202. The connective terminal 207 is distanced from the first interconnection layer 208. The second interconnection 209 is unitary connected with the connective terminal 207. A resistive element 211 is further provided over the insulation thin film 205 over the intermediate region of the p-type substrate 201. A first side of the resistive element 211 is connected with the second interconnection 209. A second side opposite to the first side of the resistive element 211 is also connected with the first interconnection 208.

As shown in FIG. 3, the first interconnection 208 is connected to a pair of diodes 217 and 218 as protective elements. A first diode 217 is connected to a power source not illustrated whilst a second diode 218 is also connected is grounded with the p-type substrate 201.

The resistive element 211 comprises a rectangular shaped polysilicon thin film. The resistive element 211 is positioned between the connective terminal 207 and the field effect transistor 202. An n-well 212 is provided in the intermediate region of the p-type substrate 201, so that the resistive element 211 is positioned over the n-well 212. A p-n junction between the n-well 212 and the p-type substrate 201 serves as a parasitic diode. The parasitic diode, the resistive element 211 and the diodes 217 and 218 form a protective circuit 219 which protect the semiconductor circuit, for example, the field effect transistor 202 from a high voltage applied to the connective terminal 207.

The n-well 212 extends more outside than the opposite edges of the resistive element 211 so that the third interconnection 210 is connected to one side portion of the n-well 212. Further, n+-region 214 is provided just under the through hole 213 so that the third interconnection 210 within the through hole 213 is connected with the n+-region 214. No field oxide film but only the insulation thin film 205 is formed under a center region of the resistive element 211. An n+-well 215 is further provided in the n-well 212 which is positioned under this center region of the resistive element 211. Namely, the n+-well 215 is isolated by the insulation thin film 205 from the resistive element 211. A passivation film 216 is also provided almost entirely over the circuitry 200 except over the connective terminal 207.

The other n-well 221 is also provided in the p-type substrate 201 and positioned under the field effect transistor 202. No field oxide film is formed over the n-well 221. At opposite ends of the surface of the n-well 221, p+-type source and drain regions 222, 223 are provided. A gate insulation film 224 is provided on the surface of the n-well 221 and between the p+-type source and drain regions 222, and 223. A gate electrode 225 is provided on the gate insulation film 224.

The insulation thin film 205 extends over the surfaces of the p+-type source and drain regions 222, and 223 and the gate electrode 225. The inter-layer insulator 206 is laminated on the insulation thin film 205. A source interconnection 226, a gate interconnection 227 and a drain interconnection 228 are provided which extend over the surface of the inter-layer insulator 206.

As shown in FIG. 3, the first interconnection 208 is connected with the gate interconnection 227. The gate interconnection 227 is unitary formed with the first interconnection 208. The first interconnection 208 is thus connected through the gate interconnection 227 to the gate electrode 225. The source interconnection 226 is connected with the source region 222. The drain interconnection 228 is connected to the drain region 223.

On the follow stage to the field effect transistor 202, various kinds of semiconductor circuits are formed. Namely, various kinds of the semiconductor circuits are integrated on the p-type substrate 201. On a peripheral region of the p-type substrate 201, a large number of lead pins not illustrated are provided or aligned. An inside portion of each of the lead pins is connected through a wire bonding to a corresponding one of the connective terminals 207. The p-type substrate 201, the bonding wires and inside portions of the lead pins are sealed within the resin package which is not illustrated.

The circuitry 200 may be applicable to various kinds of electronic components. Outside portions of the lead pins project from surface of the resin package so that the outside portions of the lead pins are connected to the electronic components, whereby various kinds of signals are inputted into or outputted from the semiconductor circuits such as the field effect transistor 202 in the circuitry 200.

When the input or output signals are inputted into or outputted from the circuitry 200, it is possible that a high voltage surge current may be applied to the connective terminal 207 of the circuitry due to static electricity. The connective terminal 207 and the semiconductor circuit, for example, the field effect transistor 202 are indirectly connected through the resistive element 211 and the diodes 217 and 218, thereby preventing the high voltage surge current from reaching the semiconductor circuit to prevent the semiconductor circuit from breaking.

The resistive element 211 is isolated by the insulation thin film 205 from the p-type substrate 201 having the n-well 212, wherein the insulation thin film 205 is positioned between the n-well 212 and the resistive element 211. Further, the resistive element 211 is also connected through the third interconnection and the n+-type region 214 to the n-well 212.

If the high voltage surge current is applied to the resistive element 211, then the potential of the n-well region 212 is also increased to the same potential as the resistive element 211, whereby no high voltage is applied across the insulation thin film 205 between the resistive element 211 and the n-well 212. Namely, when the high voltage surge current is applied to the resistive element 211, the surge current flows through the third interconnection 210 and the n+-type region 214 to the n-well 212, whereby the potential of the n-well 212 is changed close to the potential of the resistive element 211, and no large potential difference is caused between the resistive element 211 and the n-well 212, thereby preventing the insulation thin film 205 from breaking.

Further, the p-n junction between the p-type substrate 201 and the n-well 212 serves as a parasitic diode, for which reason a normal voltage level current which is different from the above high voltage surge current does not flow across the p-n junction between the p-type substrate 201 and the n-well 212, and thus no normal voltage level current is applied to the p-type substrate 201. However, abnormally high voltage current, for example, the surge current penetrates through the p-n junction between the p-type substrate 201 and the n-well 212, for example, causes the break down of the diodes 217 and 218 and the parasitic diode, whereby the surge current flows to the pR-type substrate 201, thereby preventing the insulation film 205 and the semiconductor circuit such as the field effect transistor 202 from breaking.

The circuitry 200 has the insulation film 203 which comprises laminations of the field oxide film 204 and the insulation thin film 205. Only the insulation thin film 205 without the field oxide film 204 provided between the resistive element 211 and the n-well 212. If a heat generation appears in the resistive element 211 by the current application, this heat may be transferred to the p-type substrate 201, thereby preventing the insulation thin film 205 from any substantive damage due to the heat generation from the second interconnection 207.

The thickness of the insulation thin film 205 is one fifth of the thickness of the field oxide film 204, for which reason the heat conductive coefficient is higher by five time than if the field oxide film 204 were extending between the resistive element 211 and the n-well 212.

In more detail, a heat resistance Rf in the case that the field oxide film 204 extends between the resistive element 211 and the n-well 212 is given by the following equation.

$$Rf = Tf/(KWL)$$

where K is the thermal conductive coefficient of the field oxide film 204, Tf the thickness of the field oxide film 204, W is the total width of the resistive element 211, and L is the total length of the resistive element 211.

The field oxide film 204 and the insulation thin film 205 are the same as each other in material composition, for which reason the thermal conductivity of them is also the sane between field oxide film 204 and the insulation thin film 205. However, the thickness Tz of the insulation thin film 205 is one fifth of the thickness Tf of the field oxide film 204, for which reason the heat resistance Rz of the insulation thin film 205 is given by the following question.

$$Rz=Tz/(KWL)=Rf/5.$$

The above structure of no field oxide film between the resistive element 211 and the n-well 212 has a reduced heat resistance which is one fifth of the heat resistance in the case of the field oxide film extending between the resistive element 211 and the ne-well 212. This means that a temperature rising rate of the resistive element 211 is reduced to be one fifth as compared to the case of the field oxide film extending between the resistive element 211 and the n-well 212.

A method of forming the above novel circuitry 200 will be described with reference to FIGS 4A through 4D.

Figure 4A:
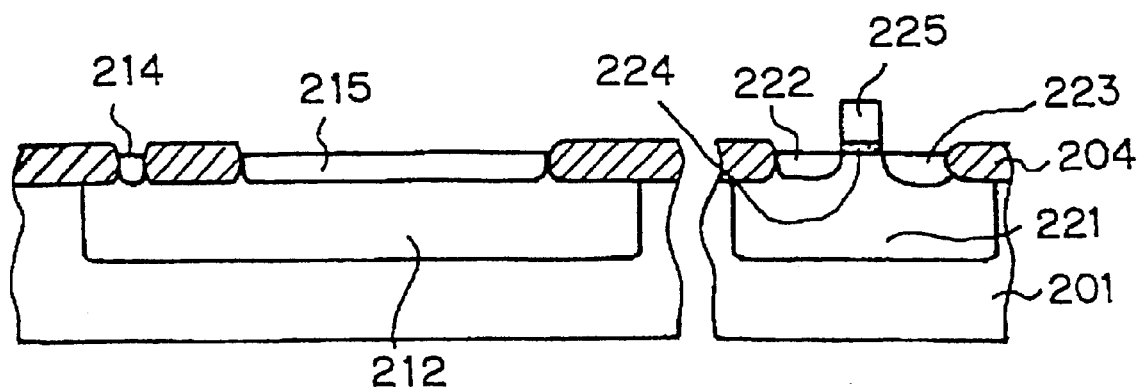
FIGS. 4A through 4D are fragmentary cross sectional elevation views illustrative of circuitry in sequential steps involved in a novel method of forming the circuitry shown in FIGS. 2A and 2B.

With reference to FIG. 4A, a field oxide film 204 is formed on a surface of the p-type substrate 201. Openings are formed in the field oxide film 204 at predetermined portions where the resistive element 211 and the semiconductor circuit, for example, the field effect transistor 202. Two n-wells 212 and 221 are concurrently formed and then the n+-type region 214 and the p+-type regions 222 and 223 are formed.

Figure 4B:
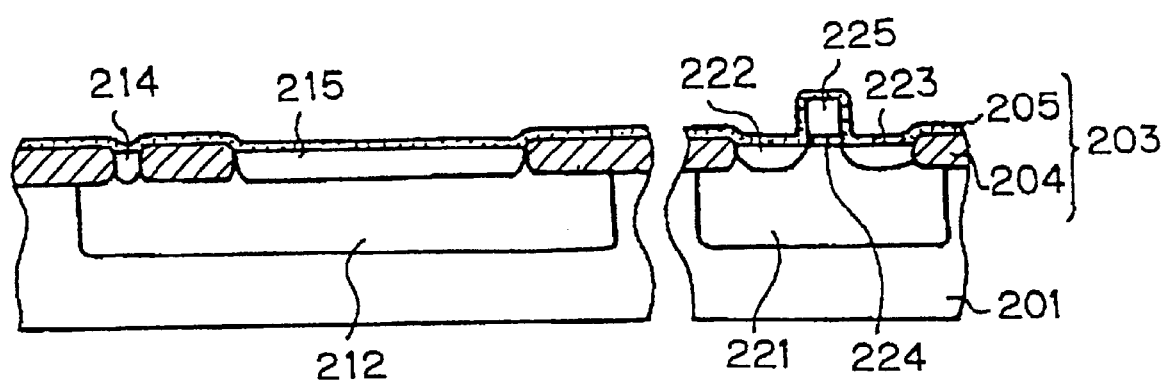

With reference to FIG. 4B, a gate insulation film 224 and a gate electrode 225 are formed on the n-well region 221 between the p+-type regions 222 and 223. An insulation thin film 205 is entirely formed.

Figure 4C:
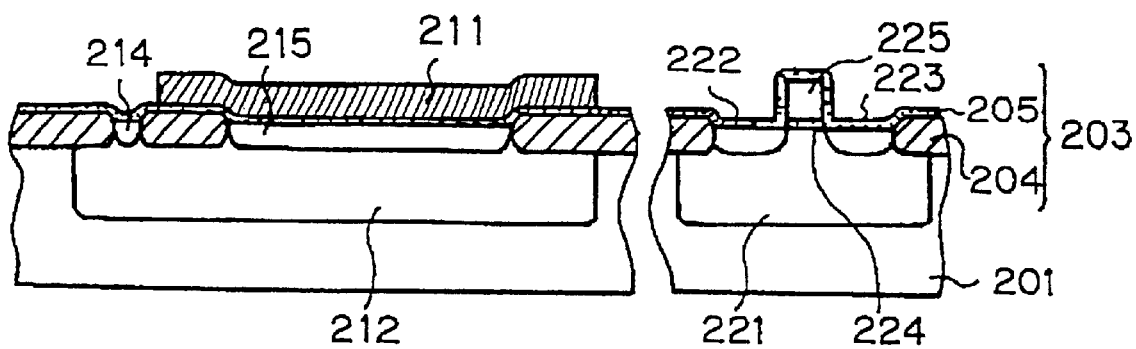

With reference to FIG. 4C, a resistive element 211 is formed on the surface of the insulation thin film 205.

Figure 4D:
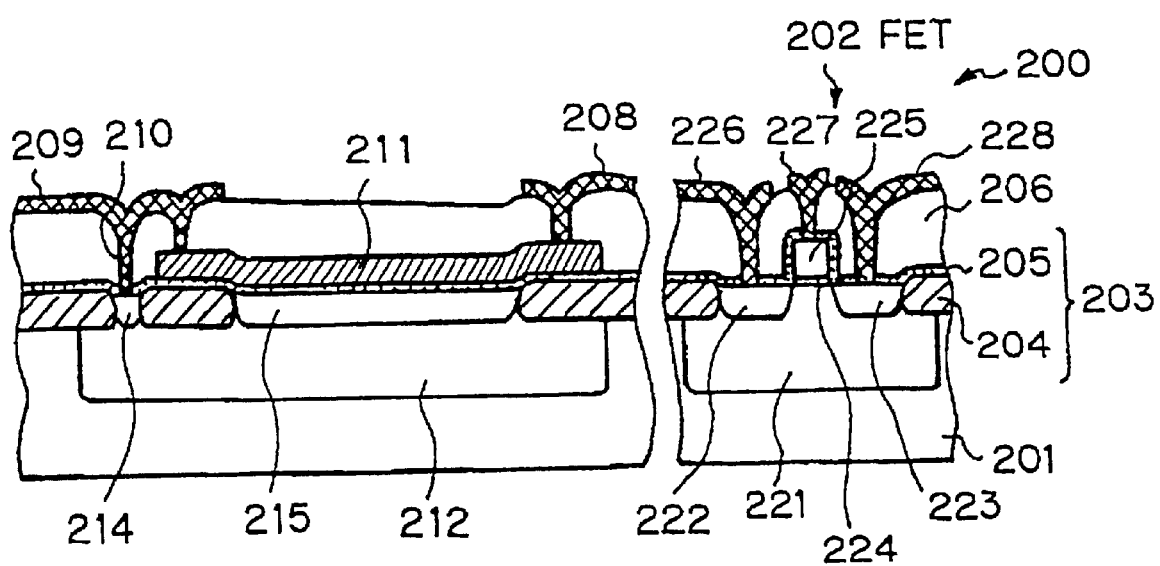

With reference to FIG. 4D, an inter-layer insulator 206 is formed entirely. Through holes are formed in the laminations of the inter-layer insulator 206 and the insulation thin film 205. The interconnections 208, 209, 210, 226, 27, 228 are formed not only within the through holes but also over the inter-layer insulator 206, whereby the circuitry 200 is completed.

The films in the region including the resistive element 211 and the films in the other region including the semiconductor circuit, for example, the field effect transistor are concurrently formed without increasing the number of the processes.

In the above embodiment, the insulation film 203 comprises laminations of the field oxide film 204 and the insulation thin film 205. Only the insulation thin film 205 is provided between the resistive element 211 and the n-well 215. But the field oxide film 204 is not provided between the resistive element 211 and the n-well 215.

A modification to this structure is, however, possible that no insulation thin film is formed and the insulation film 203 comprises a single layer of the field oxide film 204. In this case, the thickness of the insulation film between the resistive element 211 and the n-well 215 is thicker than the above embodiment, whereby the heat conductive coefficient from the resistive element 211 to the p-type substrate 201 is lower than the first embodiment. However, the number of the process is decreased, whereby the productivity is improved.

A further modification to the above process is also possible, where the insulation thin film under the resistive element 211 is concurrently formed as the gate insulation film of the field effect transistor as the semiconductor circuit, without lowering the productivity. FIGS. 5A through 5D are fragmentary cross sectional elevation views illustrative of the circuitry in the sequential processes involved in the modified fabrication method to the method shown in FIGS. 4A through 4D.

Figure 5A:
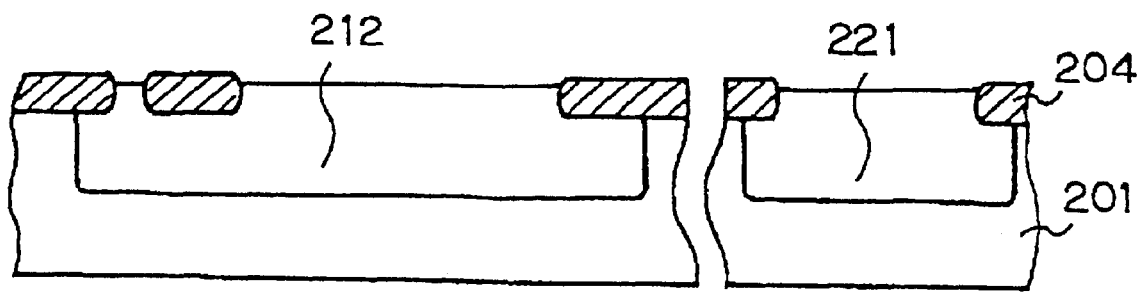
FIGS. 5A through 5D are fragmentary cross sectional elevation views illustrative of the circuitry in the sequential processes involved in the modified fabrication method to the method shown in FIGS. 4A through 4D.

With reference to FIG. 5A, a field oxide film 204 is formed on a surface of the p-type substrate 201. Two n-wells 212 and 221 are concurrently formed.

Figure 5B:
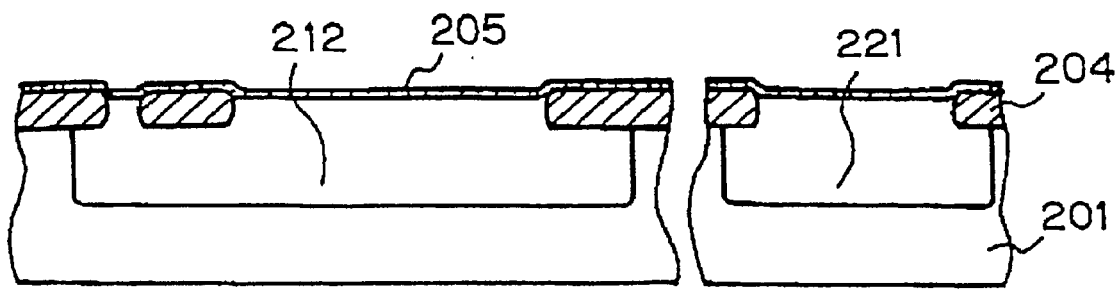

With reference to FIG. 5B, an insulation thin film 205 is entirely formed on the field oxide films 204 and the n-wells 212 and 221 and the p-type substrate 201.

Figure 5C:
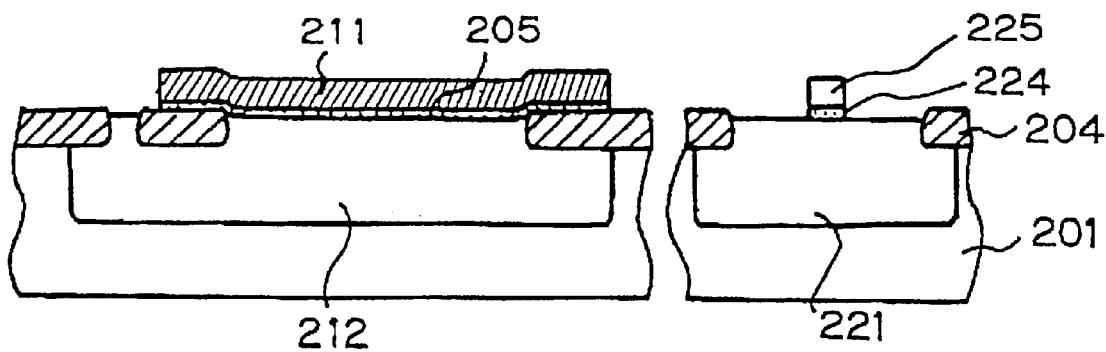

With reference to FIG. 5C, a resistive element 211 is formed on the surface of the insulation thin film 205, so that the resistive element 211 is positioned over the n-well 212.

Figure 5D:
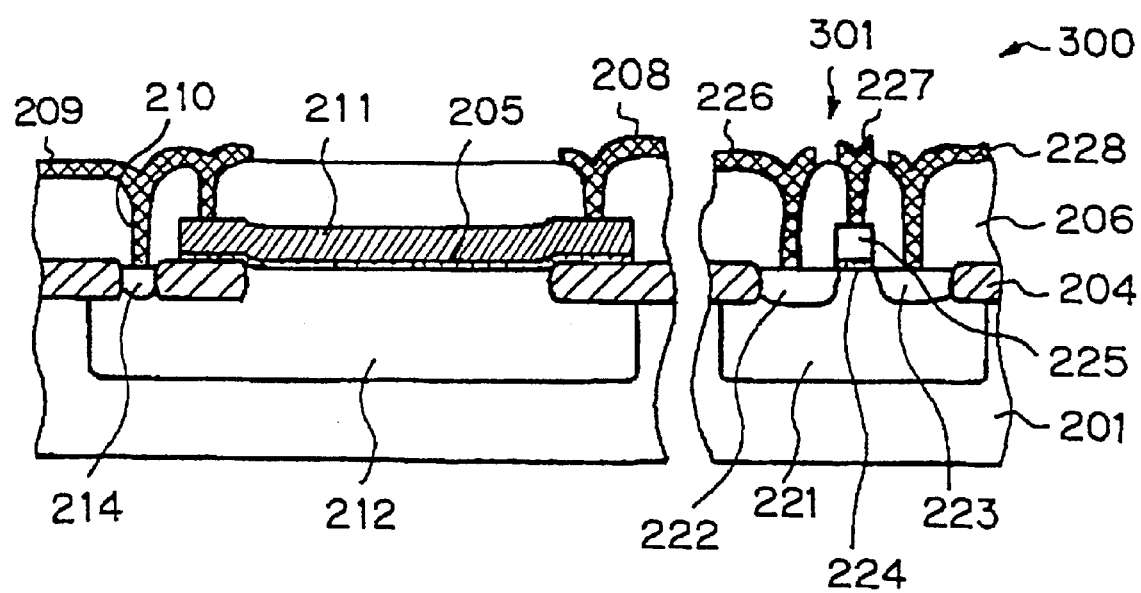

With reference to FIG. 5D, a gate insulation film 224 and a gate electrode 225 are formed on the n-well region 221 between the p+-type regions 222 and 223. An interlayer insulator 206 is formed entirely. Through holes are formed in the laminations of the inter-layer insulator 206 and the insulation thin film 205. The interconnections 208, 209, 210, 226, 27, 228 are formed not only within the through holes but also over the inter-layer insulator 206, whereby the circuitry 300 is completed.

A furthermore modification to the above first embodiment is also possible to omit the n+-type region 215 in the n-well 212. As shown in FIGS. 5A through 5D, the insulation thin film 205 and the resistive element 211 are formed on the n-well 212 before the n-type region 214 is formed so that the n+-type region 215 is not formed under the insulation thin film 205 under the resistive element 205 to form a modified circuitry 300.

In addition, if the thickness of the field oxide film 204 is 500 nanometers in general, the thickness o the insulation thin film 205 is not thicker than one half of the field oxide film 204 to reduce the heat conductivity, However, it is not preferable in view of the necessary withstand voltage that the thickness of the insulation thin film 205 is not thicker than 5.0 nanometers as one hundredth of the thickness of the field oxide film 204. It is preferable that the thickness of the insulation thin film 205 is in the range of 1/2 to 1/100 of the field oxide film 204. It is more referable that the thickness of the insulation thin film 205 is in the range of 1/5 to 1/50 of the field oxide film 204.

Further, a moreover modification to the above invention is possible that the conductivity types of the substrate and the well region are inverted. When the substrate is grounded, then it is preferable that the conductivity type of the substrate is p-type. If the substrate is fixed at a high voltage as a reference voltage level, then it is preferable that the conductivity type of the substrate is n-type.

Second Embodiment

Figure 6A:
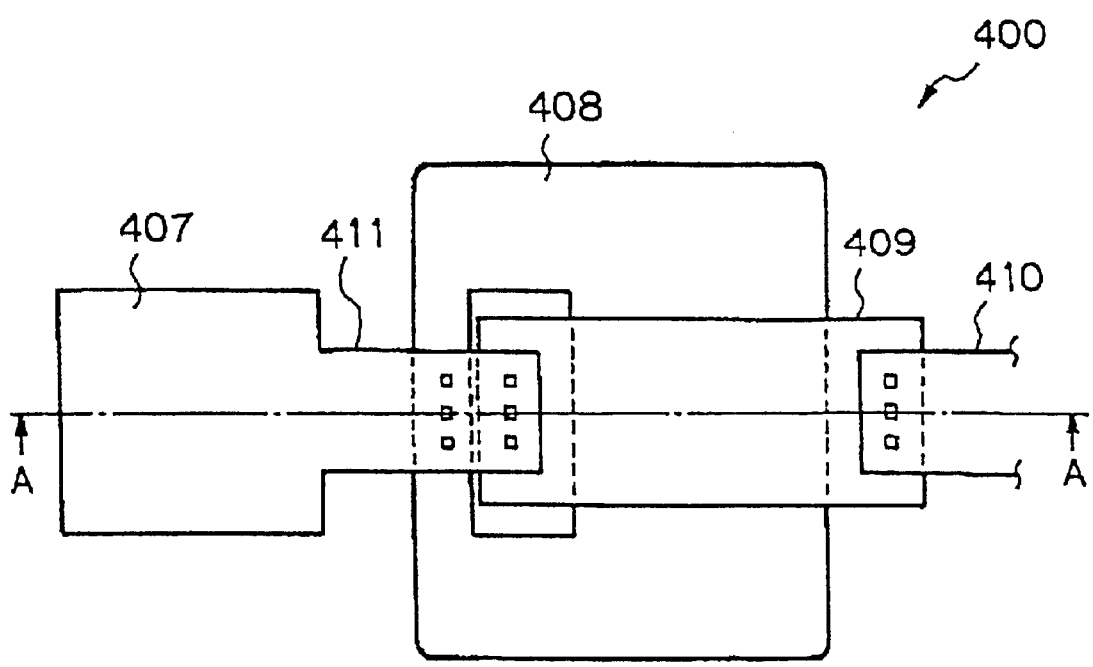
FIG. 6A is a fragmentary plan view illustrative of a novel circuitry in a second embodiment in accordance with the present invention.
Figure 6B:
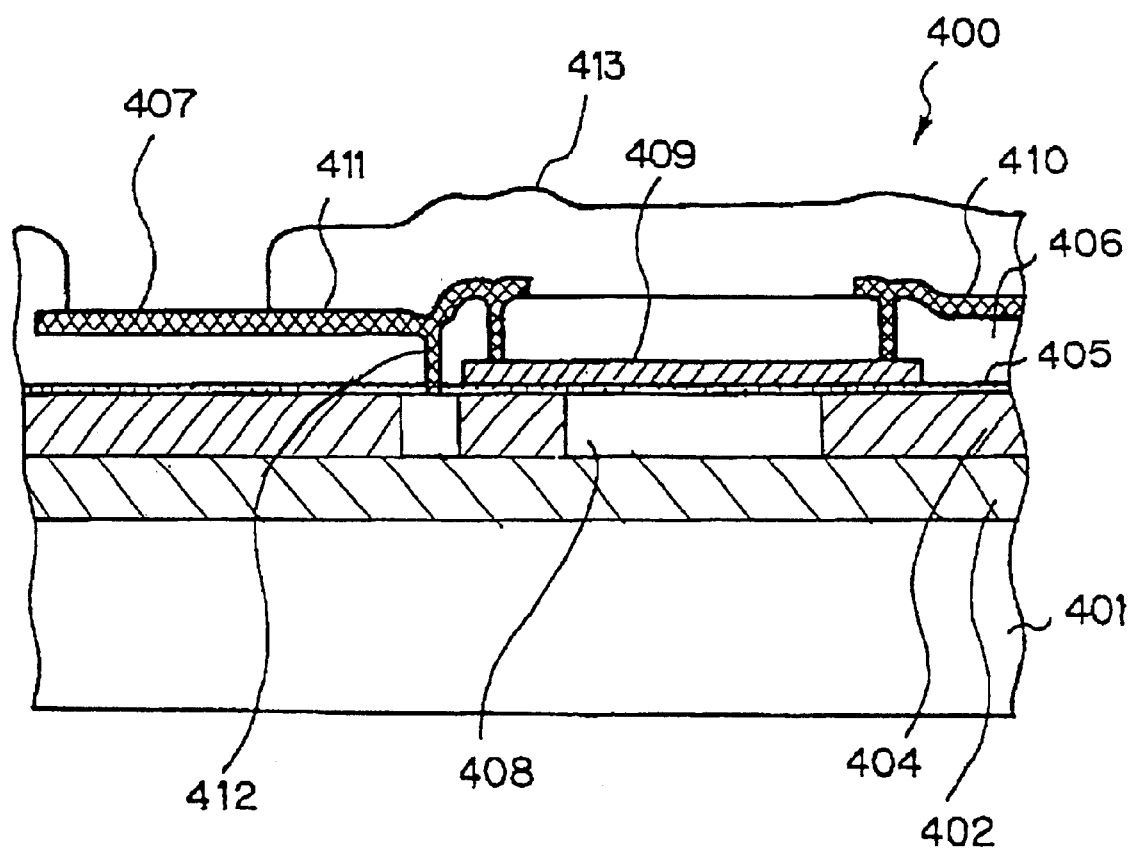
FIG. 6B is a fragmentary cross sectional elevation view illustrative of a novel circuitry taken along an A—A line of FIG. 6A.

A second embodiment according to the present invention will be described in detail with reference to the drawing. FIG. 6A is a fragmentary plane view illustrative of a novel circuitry in a second embodiment in accordance with the present invention. FIG. 6B is a fragmentary cross sectional elevation view illustrative of a novel circuitry taken along an A—A line of FIG. 6A. FIGS. 7A through 7D are fragmentary cross sectional elevation views illustrative of circuitry in sequential steps involved in a novel method of forming the circuitry shown in FIGS. 6A and 6B.

The circuitry 400 has a p-type substrate 401. A first oxide film 402 is formed on the surface of the p-type substrate 401 to form a silicon on insulator substrate. A semiconductor circuit, for example, a field effect transistor 403 is formed on the silicon on insulator substrate. A structural difference of the second novel circuitry of this embodiment from the above circuitry in the first embodiment is only in that the circuitry and the semiconductor circuits are formed on the silicon on insulator substrate.

A field oxide film 404 is formed on the first oxide film 402 for isolating the semiconductor circuit, for example, the field effect transistor 403. An insulation thin film 405 is formed on the field oxide film 404. An inter-layer insulator 406 is formed on the insulation thin film 405. A connective terminal 407 is formed on the inter-layer insulator 406 and positioned distanced from the semiconductor circuit, for example, the field effect transistor 403. An n-well 408 is formed in the field oxide film 404 and positioned between the connective terminal 407 and the semiconductor circuit, for example, the field effect transistor 403. A resistive element 409 is formed on the insulation thin film 405 over the n-well 408.

First and second interconnections 410 and 411 extend over the inter-layer insulator 406. The first interconnection 410 inter-connects one end of the resistive element 409 and the semiconductor circuit, for example, the field effect transistor 403. The second interconnection 411 inter-connects other end of the resistive element 409 and the connective terminal 407. Through holes are formed in the inter-layer insulator 406 so that the through holes are positioned under the second interconnection 411. A third inter-connection 412 is provided which inter-connects the second interconnection 411 and the n-well 408. A passivation film 413 is entirely formed.

The circuitry 400 may be applicable to various kinds of electronic components. Outside portions of the lead pins project from surface of the resin package so that the outside portions of the lead pins are connected to the electronic components, whereby various kinds of signals are inputted into or outputted from the semiconductor circuits such as the field effect transistor 403 in the circuitry 400.

When the input or output signals are inputted into or outputted from the circuitry 400, it is possible that a high voltage surge current may be applied to the connective terminal 407 of the circuitry due to static electricity. The connective terminal 407 and the semiconductor circuit, for example, the field effect transistor 403 are indirectly connected through the resistive element 409 and the diodes, thereby preventing the high voltage surge current from reaching the semiconductor circuit to prevent the semiconductor circuit from breaking.

The resistive element 409 is isolated by the insulation thin film 405 from the n-well 408, wherein the insulation thin film 405 is positioned between the n-well 408 and the resistive element 409. Further, the resistive element 409 is also connected through the third interconnection to the n well well 408.

If the high voltage surge current is applied to the resistive element 409, then the potential of the n-well region 408 is also increased to the same potential as the resistive element 409, whereby no high voltage is applied across the insulation thin film 405 between the resistive element 409 and the n-well 408. Namely, when the high voltage surge current is applied to the resistive element 409, the surge current flows through the third interconnection 412 to the n-well 408, whereby the potential of the n-well 408 is changed close to the potential of the resistive element 409, and no large potential difference is caused between the resistive element 409 and the n-well 408, thereby preventing the insulation thin film 405 from breaking.

Further, the p-n junction between the p-type substrate 401 and the n-well 408 serves as a parasitic diode, for which reason a normal voltage level current which is different from the above high voltage surge current does not flow across the p-n junction between the p-type substrate 401 and the n-well 408, and thus no normal voltage level current is applied to the p-type substrate 401. However, abnormally high voltage current, for example, the surge current penetrates through the p-n junction between the p-type substrate 401 and the n-well 408, for example, causes the break down of the diodes and the parasitic diode, whereby the surge current flows to the p-type substrate 401, thereby preventing the insulation film 405 and the semiconductor circuit such as the field effect transistor 403 from breaking.

The circuitry 400 has the insulation film 403 which comprises laminations of the field oxide film 404 and the insulation thin film 405. Only the insulation thin film 405 is field oxide film 404 provided between the resistive element 411 and the n-well 412. If a heat generation appears in the resistive element 411 by the current application, this heat may be transferred to the p-type substrate 401, thereby preventing the insulation thin film 405 from any substantive damage due to the heat generation from the second interconnection 407.

The thickness of the insulation thin film 405 is one fifth of the thickness of the field oxide film 404, for which reason the heat conductive coefficient is higher by few times than if the field oxide film 404 were extending between the resistive element 409 and the n-well 408.

The field oxide film 404 and the insulation thin film 405 are the same as each other in material composition, for which reason the thermal conductivity of them is also the same between field oxide film 404 and the insulation thin film 405. However, the thickness Tz of the insulation thin film 405 is thinner of the thickness Tf of the field oxide film 404.

The above structure of no field oxide film between the resistive element 409 and the n-well 408 has a reduced heat resistance which is lower than the case of the field oxide film extending between the resistive element 409 and the n-well 408. This means that a temperature rising rate of the resistive element 409 is reduced to be one fifth as compared to the case of the field oxide film extending between the resistive element 409 and the n-well 408.

The above novel circuitry 400 may be fabricated in the method shown in FIGS. 7A through 7D.

Figure 7A:
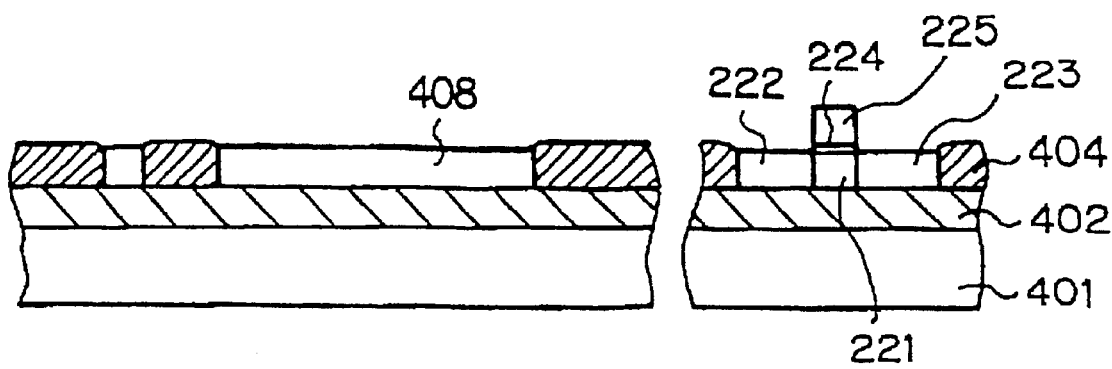
FIGS. 7A through 7D are fragmentary cross sectional elevation views illustrative of circuitry in sequential steps involved in a novel method of forming the circuitry shown in FIGS. 6A and 6B.

With reference to FIG. 7A, an insulation film 402 is formed on a p-type substrate 401 to form a silicon on insulator substrate. A field oxide film 404 is formed on a surface of the silicon on insulator substrate. Openings are formed in the field oxide film 404 at predetermined portions where the n-well 408 and the semiconductor circuit, for example, the field effect transistor. An n-well is concurrently formed. A gate insulation film 224 and a gate electrode 225 are formed on the n-well region 221 between p+-type regions 222 and 223.

Figure 7B:
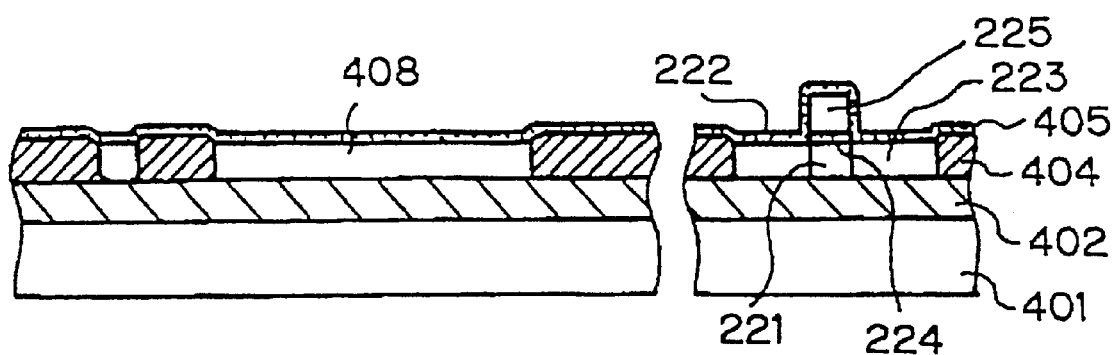

With reference to FIG. 7B, an insulation thin film 405 is entirely formed.

Figure 7C:
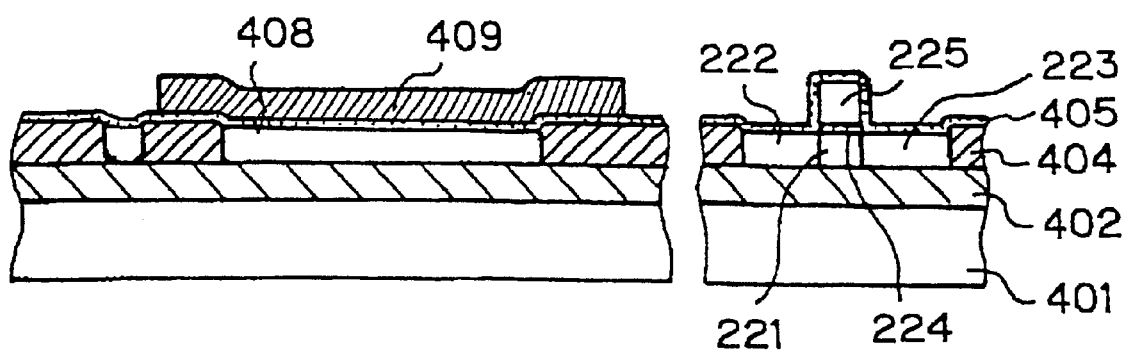

With reference to FIG. 7C, a resistive element 409 is formed on the surface of the insulation thin film 405.

Figure 7D:
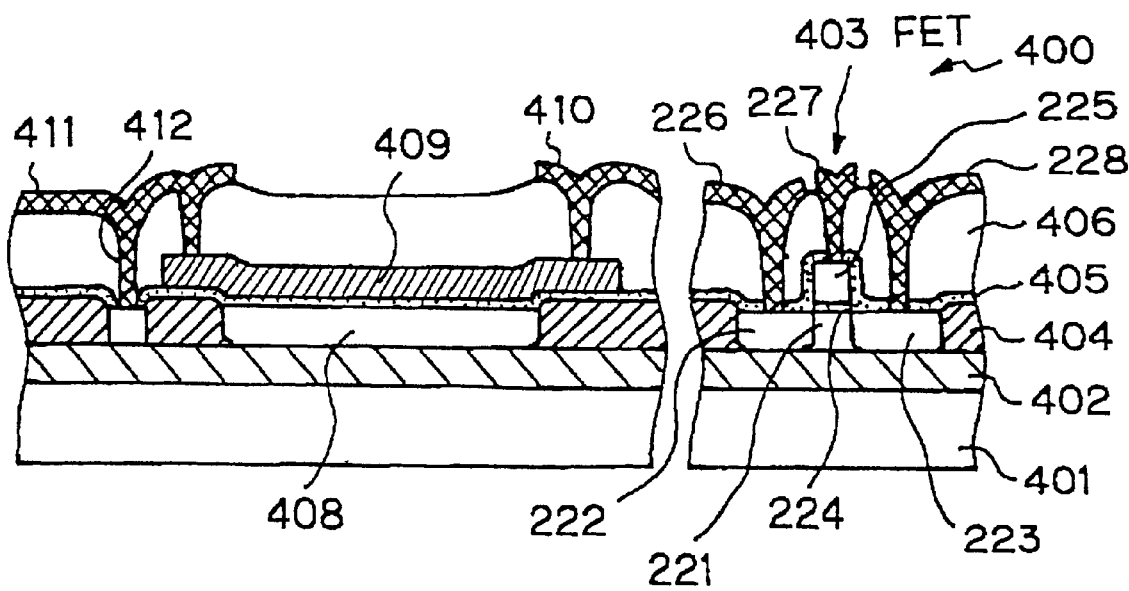

With reference to FIG. 7D an inter-layer insulator 406 is formed entirely. Through holes are formed in the laminations of the inter-layer insulator 406 and the insulation thin film 405. The interconnections 410, 411, 412, 226, 227, 228 are formed not only within the through holes but also over the inter-layer insulator 406, whereby the circuitry 400 is completed.

The films in the region including the resistive element 409 and the films in the other region including the semiconductor circuit, for example, the field effect transistor are concurrently formed without increasing the number of the processes.

A modification to the above invention is possible that the conductivity type of the well region is inverted independently form the conductivity type of the substrate.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuitry between at least a connective terminal and at least a semiconductor circuit device, said circuitry comprising:
    at least a resistive element;
    a first interconnection inter-connecting a first side portion of said resistive element to said semiconductor circuit device; and
    a second interconnection inter-connecting a second side portion of said resistive element to said connective terminal,
    wherein at least a center portion except for said first and second side portions of said resistive element extends on a thin insulator portion which is provided on a semiconductor region, so that said thin insulator portion is sandwiched between said semiconductor region and said at least said center portion of said resistive element, whilst said first and second portions of said resistive element extend on a thick insulator portion which is thicker than said thin insulator portion, and
    wherein said semiconductor region is electrically connected to said second interconnection so as to allow a potential of said semiconductor region to follow a potential of said resistive element.

2. The circuitry as claimed in claim 1, wherein said semiconductor region comprises a semiconductor well region of a first conductivity type.

3. The circuitry as claimed in claim 2, wherein said semiconductor well region is provided in a semiconductor substrate of a second conductivity type.

4. The circuitry as claimed in claim 2, wherein said semiconductor well region is formed in a larger semiconductor well region having said first conductivity type which is provided in a semiconductor substrate of a second conductivity type.

5. The circuitry as claimed in claim 2, wherein said semiconductor well region is formed in a field oxide film, and said semiconductor well region and said field oxide film are provided on a silicon on insulator substrate.

6. The circuitry as claimed in claim 1, wherein said thin insulator portion comprises a thin insulation film, whilst said thick insulator comprises laminations of a thick insulation film and said thin insulation.

7. The circuitry as claimed in claim 1, wherein a ratio in thickness of said thin insulator portion to said thick insulator portion is in the range of 1/2 to 1/100.

8. A circuitry between at least a connective terminal and at least a semiconductor circuit device, said circuitry comprising:
    at least a resistive element;
    a first interconnection inter-connecting said resistive element to said semiconductor circuit device; and
    a second interconnection inter-connecting said resistive element to said connective terminal,
    wherein at least said resistive element extends on at least a part of an insulator that extends on at least a semiconductor region, so that said at least a part of said insulator is sandwiched between said semiconductor region and said resistive element,
    wherein said semiconductor region comprises a semiconductor well region of a first semiconductor type and wherein said semiconductor well region is formed in a field oxide film, and said semiconductor well region and said field oxide film are provided on a silicon on insulator substrate.

9. The circuitry as claimed in claim 8, wherein said resistive element has a first side portion in contact with said first interconnection, and a second side portion in contact with said second interconnection, and said insulator comprises a thin insulator portion which is provided on said semiconductor region and a thick insulator portion, and said resistive element except for said first and second side portions extends on said thin insulator portion, so that said thin insulator portion is sandwiched between said semiconductor region and at least a center portion of said resistive element, whilst said first and second portions of said resistive element extend on said thick insulator portion.

10. The circuitry as claimed in claim 8, wherein said resistive element has a first side portion in contact with said first interconnection, and a second side portion in contact with said second interconnection, and said insulator has a single-layered structure which comprises a field oxide film, and said resistive element extends on a part of said field oxide film, so that a thin portion of said insulator is sandwiched between said semiconductor region and said resistive element.

11. The circuitry as claimed in claim 8, wherein said semiconductor region is electrically connected to said second interconnection so as to allow a potential of said semiconductor region to follow a potential of said resistive element.

12. The circuitry as claimed in claim 8, wherein said semiconductor well region is formed in a semiconductor substrate of a second conductivity type.

13. The circuitry as claimed in claim 9, wherein said thin insulator portion comprises a thin insulation film, whilst said thick insulator comprises laminations of a thick insulation film and said thin insulation film.

14. The circuitry as claimed in claim 13, wherein a ratio in thickness of said thin insulator portion to said thick insulator portion is in the range of 1/2 to 1/100.

15. A circuitry between at least a connective terminal and at least a semiconductor circuit device, said circuitry comprising:
    at least a resistive element;
    a first interconnection inter-connecting a first side portion of said resistive element to said semiconductor circuit device; and
    a second interconnection inter-connecting a second side portion of said resistive element to said connective terminal,
    wherein at least a center portion except for said first and second side portions of said resistive element extends on a non-laminated part of a thin insulation film extending on at least a semiconductor well region of a first conductivity type, so that said thin insulation film is sandwiched between said semiconductor well region and said at least said center portion of said resistive element, whilst said first and second portions of said resistive element extend on a laminated part of a thick insulator portion which is laminated on a field oxide film and which is thicker than said thin insulation film, and
    wherein said semiconductor well region is electrically connected to said second interconnection so as to allow a potential of said semiconductor well region to follow a potential of said resistive element.

16. The circuitry as claimed in claim 15, wherein said semiconductor well region is provided in a semiconductor substrate of a second conductivity type.

17. The circuitry as claimed in claim 15, wherein said semiconductor well region is formed in a larger semiconductor well region having said first conductivity type which is provided in a semiconductor substrate of a second conductivity type.

18. The circuitry as claimed in claim 15, wherein said semiconductor well region is formed in said field oxide film, and said semiconductor well region and said field oxide film are provided on a silicon on insulator substrate.

19. The circuitry as claimed in claim 15, wherein a ratio in thickness of said thin insulation film to said thick insulator portion is in the range of 1/2 to 1/100.

* * * * *